(12) United States Patent
Gregory et al.

(10) Patent No.: US 11,985,800 B2
(45) Date of Patent: May 14, 2024

(54) SYSTEMS AND METHODS FOR MULTIPHASE THERMAL MANAGEMENT

(71) Applicant: Microsoft Technology Licensing, LLC, Redmond, WA (US)

(72) Inventors: Luke Thomas Gregory, Mercer Island, WA (US); Jason David Adrian, Woodinville, WA (US)

(73) Assignee: Microsoft Tech nology Licensing, LLC, Redmond, WA (US)

( * ) Notice: Subject to any disclaimer, the term of this patent is extended or adjusted under 35 U.S.C. 154(b) by 19 days.

(21) Appl. No.: 17/699,702

(22) Filed: Mar. 21, 2022

(65) Prior Publication Data
US 2023/0301036 A1    Sep. 21, 2023

(51) Int. Cl.
*H05K 7/20*    (2006.01)
(52) U.S. Cl.
CPC ..... *H05K 7/20809* (2013.01); *H05K 7/20336* (2013.01)
(58) Field of Classification Search
CPC .................. H05K 7/20809; H05K 7/20336
See application file for complete search history.

(56) References Cited

U.S. PATENT DOCUMENTS

| | | | | |
|---|---|---|---|---|
| 8,587,945 B1 * | 11/2013 | Hartmann | ............... | H01L 23/42 361/720 |
| 9,082,752 B2 * | 7/2015 | Chen | .................. | H01L 23/4275 |
| 10,897,837 B1 * | 1/2021 | Chehade | ............ | H05K 7/20809 |
| 2010/0254092 A1 | 10/2010 | Dong et al. | | |
| 2014/0002998 A1 | 1/2014 | Pidwerbecki et al. | | |
| 2020/0294884 A1 * | 9/2020 | Shaikh | .................... | H01L 23/38 |
| 2021/0168970 A1 * | 6/2021 | Chehade | ............ | H05K 7/20327 |
| 2021/0410319 A1 | 12/2021 | Manousakis et al. | | |

FOREIGN PATENT DOCUMENTS

WO    2020197982 A1    10/2020

OTHER PUBLICATIONS

"International Search Report and Written Opinion Issued in PCT Application No. PCT/US22/052610", dated Apr. 6, 2023, 13 Pages.
"Azure sustainability", Retrieved From: https://web.archive.org/web/20200917035818/https://azure.microsoft.com/en-us/global-infrastructure/sustainability/, Sep. 17, 2020, 11 Pages.

* cited by examiner

*Primary Examiner* — Mukundbhai G Patel
(74) *Attorney, Agent, or Firm* — RAY QUINNEY & NEBEKER P.C.; Paul N. Taylor

(57) ABSTRACT

A thermal management system for a computing device includes a support board, a heat-generating component fixed to the support board, an enclosure, and a PCM. The heat-generating component is fixed to the support board on a first side of the support board, and the enclosure is fixed to the first side of the support board and encloses at least the heat-generating component. The PCM is positioned in the enclosure and configured to receive heat from the heat-generating component. The PCM is solid at 10° C.

20 Claims, 4 Drawing Sheets

SYSTEMS AND METHODS FOR MULTIPHASE THERMAL MANAGEMENT

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Phase change materials can provide greater heat capacity relative to the same thermal mass without a phase change.

BRIEF SUMMARY

In some embodiments, a thermal management system for a computing device includes a support board, a heat-generating component fixed to the support board, an enclosure, and a PCM. The heat-generating component is fixed to the support board on a first side of the support board, and the enclosure is fixed to the first side of the support board and encloses at least the heat-generating component. The PCM is positioned in the enclosure and configured to receive heat from the heat-generating component. The PCM is solid at 10° C.

In some embodiments, a thermal management system for a computing device includes a support board, a heat-generating component fixed to the support board, an enclosure, a PCM, and a cooling conduit. The heat-generating component is fixed to the support board on a first side of the support board, and the enclosure is fixed to the first side of the support board and encloses at least the heat-generating component. The PCM is positioned in the enclosure and configured to receive heat from the heat-generating component. The PCM is solid at 10° C. The cooling conduit is positioned at least partially in the enclosure and contacting the PCM.

In some embodiments, a thermal management system for a computing device includes a support board, a heat-generating component fixed to the support board, and a PCM. The heat-generating component is fixed to the support board on a first side of the support board. The PCM is positioned in the enclosure and configured to receive heat from the heat-generating component. The PCM is solid at 10° C.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 7-1 is a cross-sectional view of a heterogeneous PCM in a solid phase, according to at least one embodiment of the present disclosure;

FIG. 7-2 is a cross-sectional view of the heterogeneous PCM of FIG. 7-1 in a partially liquid phase, according to at least one embodiment of the present disclosure;

DETAILED DESCRIPTION

Figure 1:
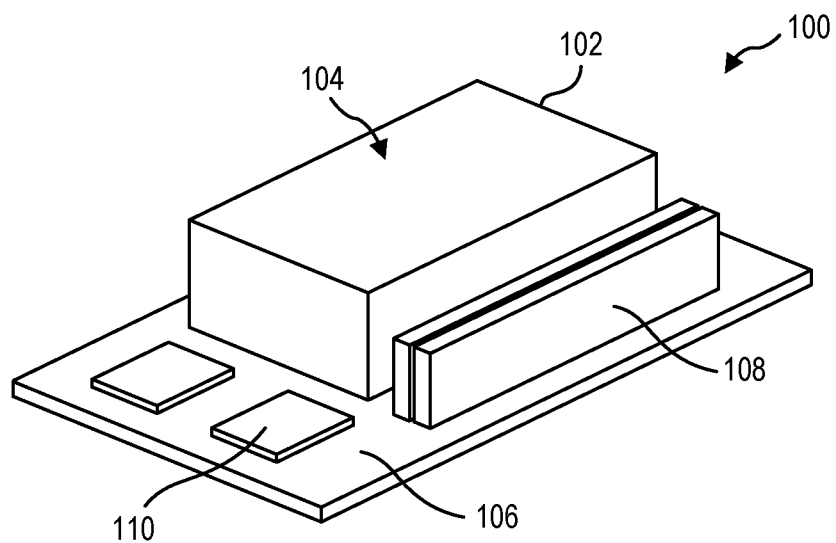
FIG. 1 is a perspective view of an encapsulation thermal management system, according to at least one embodiment of the present disclosure.

The present disclosure relates generally to systems and methods for thermal management of electronic devices or other heat-generating components. In some embodiments, a thermal management system encases, encapsulates, or encloses at least one heat-generating component in a phase change material (PCM). A PCM can absorb a greater amount of heat than the thermal capacity and/or thermal mass of the PCM by undergoing a phase transition. Because an input energy is needed to transition between physical phases, such as a solid phase to a liquid phase, that input energy is absorbed by the PCM without an associated increase in temperature. The PCM can therefore absorb heat from a heat-generating component equal to the latent heat of melting of the PCM without the PCM increasing in temperature and continuing to absorb heat from the heat-generating component.

In some embodiments of a thermal management system according to the present disclosure, the PCM encapsulates at least one heat-generating component of an electronic device, such as a computing device. The PCM provides thermal management to the electronic device by absorbing heat from the heat-generating device. The PCM can conduct the heat away to exhaust heat from the heat-generating component, and the PCM can absorb heat through the latent heat of melting to remove heat from the heat-generating component without an associated increase in the surroundings of the heat-generating component.

The PCM encapsulates the heat-generating component by being melted or formed around the shape of the heat-generating component. In some embodiments, the PCM contacts substantially all outer surfaces of the heat-generating component. In a particular example, the PCM contacts and cools a processor of a server computer. The processor has a contact side that includes contact pins to provide electrical and/or data communication with a socket of a support board, such as a motherboard of the electronic device. The processor contacts the socket on the contact side and has outer surfaces, such as lateral sides and a top side of the processor, oriented away from and/or not contacting the support board. The PCM contacts the outer surfaces of the processor that are exposed and, in some embodiments, contacts the support board. The PCM, therefore, contacts the processor on all available surfaces that are not contacting other components of the electronic device.

In some embodiments, the heat-generating component includes a heat sink. For example, the heat-generating component may be a processor, as described herein, with a heat sink attached to a top surface thereof. The heat sink may be thermally connected to the processor by a thermal interface material to spread heat from the processor over a larger surface area than a top side of the processor alone. In some embodiments, the PCM encapsulated the heat-generating component by being positioned to encapsulate the heat sink and processor.

While a processor and, optionally, a heat spreader or heat sink, is described, other heat-generating components may be encapsulated according to the present disclosure. In some examples, a heat-generating component includes a processor, such as a central processing unit (CPU), graphical processing unit (GPU), or other specialized processor; a memory device, such as volatile memory or non-volatile memory; networking or communication devices; power supplies, converters, rectifiers, transformers, inverters, or other power management devices; or any other electronic components of the electronic device that generate heat during operation.

The PCM may encapsulate a heat-generating component of the electronic device. In some embodiments, the PCM encapsulates more than one heat-generating component of the electronic device, such as encapsulating the CPU and the GPU or encapsulating the CPU and system memory. In some embodiments, the PCM encapsulates all of the heat-generating components of the electronic device.

FIG. 1 is a perspective view of an embodiment of an electronic device 100 with a thermal management system including a PCM 102 in an enclosure 104. The enclosure encloses at least one heat-generating component fixed to the support board 106. In some embodiments, at least one heat-generating component is outside of the enclosure, such as the system memory 108 and/or non-volatile solid-state drive (SSD) 110.

The enclosure 104 may be rectilinear, such as in the embodiment illustrated in FIG. 1. In other embodiments, at least a portion of the enclosure 104 is curved or oriented at a non-orthogonal angle to another surface of the enclosure 104. In some embodiments, at least a portion of the enclosure 104 is sized, shaped, or oriented to follow a size, shape, or orientation of a heat-generating component therein. For example, a shape of the enclosure may follow or conform to a physical topography of the heat-generating components enclosed therein to hold a substantially consistent thickness of PCM against the outer surfaces of the heat-generating components encapsulated in the PCM.

In some embodiments, the PCM is in direct contact with an outer surface of the heat-generating component. In other embodiments, at least a portion of the PCM contacts the heat-generating component indirectly through material or heat spreader in direct contact with the heat-generating component. For example, a heat-generating component, such as a CPU or GPU, may have a thermal interface material positioned thereon. In some embodiments, a thermal interface material or heat sink affixed thereto may be considered part of the heat-generating component. In other embodiments, a PCM is considered to be in contact with the heat-generating component when the PCM contacts the heat-generating component and any additional components affixed to the heat-generating component that have a primary purpose of distributing heat from the heat-generating component.

In addition to the thermal management benefits, in some embodiments, the PCM may provide improvements to the operational lifetime of the heat-generating components encapsulated therein by limiting and/or preventing corrosion. For example, the PCM may seal the heat-generating component against a surface of the support board such that ambient air and/or moisture cannot contact and react with at least part of the heat-generating component. For example, in a datacenter or server rack with liquid cooling systems, a liquid leak can damage electronic components of computing devices, while any heat-generating components encapsulated in PCM may be substantially protected from the liquid leak.

In some embodiments, the PCM is or includes paraffin or another wax. In other embodiments, the PCM is or includes poly chain hydrocarbons.

In some embodiments, the PCM may be or include a single chemical constituent. In other embodiments, the PCM may be or include a plurality of chemical constituents mixed or combined to provide different material properties from either chemical constituent alone. For example, and as will be described herein, the PCM may be a eutectic mixture of a plurality of chemical constituents. In some examples, the PCM may be a substantially homogeneous mixture of chemical constituents. In some examples, the PCM may be a heterogeneous mixture of chemical constituents.

In some embodiments, the PCM may be solid at greater than 10° C. In some embodiments, the PCM is solid at greater than 20° C. In some embodiments, the PCM is solid at greater than 30° C. In some embodiments, the PCM is solid at greater than 50° C.

In some embodiments, the PCM has a single melting temperature such as a PCM with a single chemical constituent. In some embodiments, the PCM is a heterogeneous mixture (e.g., immiscible mixture) of different chemical constituents with different melting temperatures, providing a PCM with two melting temperatures.

Figure 2:
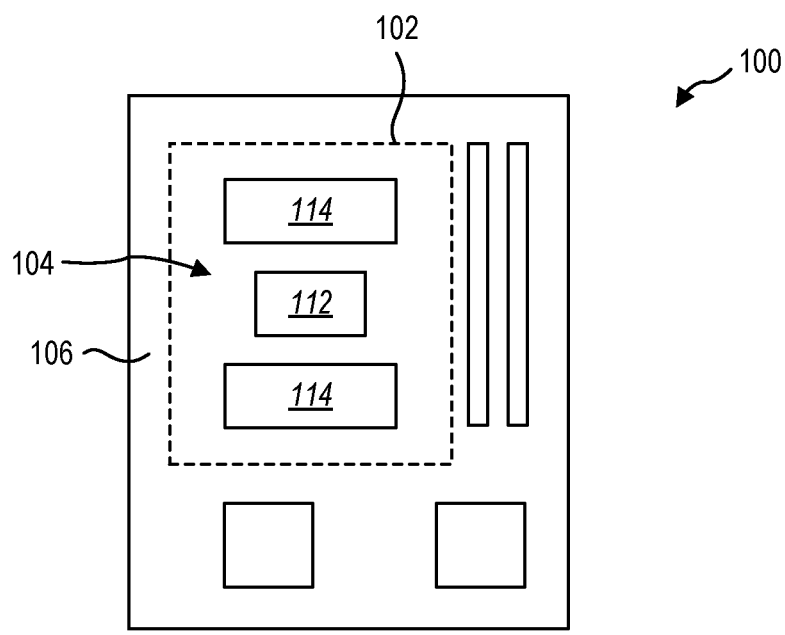
FIG. 2 is a top partial cutaway view of the encapsulation thermal management system of FIG. 1, according to at least one embodiment of the present disclosure.

FIG. 2 is a top view of the embodiment of the electronic device 100 of FIG. 1. The enclosure 102 encloses a processor 112 and two volatile memory modules 114. In some embodiments, the enclosure 102 encloses a plurality of the same type of components of the electronic device 100. In other embodiments, the enclosure 102 encloses a plurality of different types of components of the electronic device 100.

The PCM 104 in the enclosure 102 contacts the heat-generating components therein, but also contacts the support board 106 between the heat-generating components. In some embodiments, the PCM 104 limits and/or prevents corrosion or degradation of the support board 106 or electrical wires or circuits thereon. In some embodiments, the PCM 104 receives heat from the support board 106 to cool the support board 106 and sockets or other contacts that may heat during operation.

Figure 3:
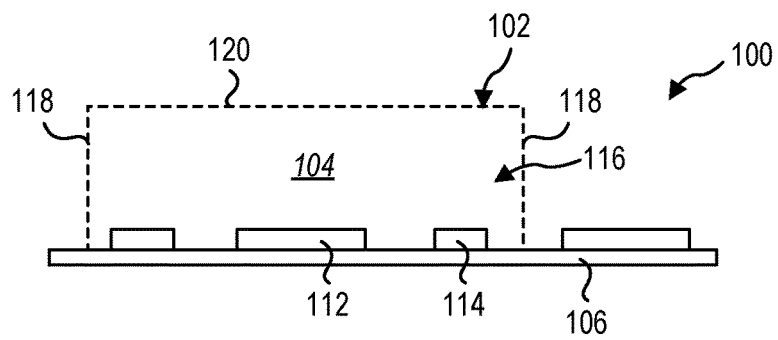
FIG. 3 is a side partial cutaway view of the encapsulation thermal management system of FIG. 1, according to at least one embodiment of the present disclosure.

FIG. 3 is a side view of the electronic device 100 described in relation to FIG. 1 and FIG. 2. In some embodiments, the enclosure 102 is completely filled by the PCM 104. For example, the PCM 104 may completely fill an interior volume 116 around the heat-generating components defined by the enclosure 102. In some embodiments, when the PCM 104 melts, the PCM 104 will remain in the volume defined by the lateral sides 118 and the top surface 120 of the enclosure 102. For example, if the PCM 104 were to fill only 50% of an interior volume 116 of the enclosure 102, the PCM 104 may flow to one lateral side 118 or the other if the support board 106 were to be installed vertically relative to a direction of gravity. The PCM 104 could then leave one or more of the heat-generating components exposed without thermal management from the PCM 104.

However, in some embodiments, the PCM 104 fills less than the entire interior volume 116 of the enclosure 102. In some embodiments, the PCM 104 fills a first portion of the interior volume 116 and a second material (solid, liquid, or gas) fills a second portion of the interior volume 116. In some embodiments, the second material stabilizes the PCM 104, such as preventing aging or degradation of the PCM 104 over time, retaining the thermal performance of the PCM 104 to provide a longer operational lifetime of the thermal management and the electronic device 100.

In some embodiments, the PCM 104 fills a portion of the interior volume 116 of the enclosure 102 such that all outer surfaces of the heat-generating components (e.g., processor 112, volatile memory 114) are covered by the PCM 104 when the support board 106 is in a horizontal position with the heat-generating components positioned above the support board 106. In some embodiments, the PCM 104 fills a portion of the interior volume 116 of the enclosure 102 such that all outer surfaces of the heat-generating components (e.g., processor 112, volatile memory 114) are covered by the PCM 104 when the support board 106 is positioned in a vertical position. In some embodiments, the PCM 104 fills a portion of the interior volume 116 of the enclosure 102 such that all outer surfaces of the heat-generating components (e.g., processor 112, volatile memory 114) are covered by the PCM 104 when the support board 106 is positioned in a vertical position and when the support board 106 is in a horizontal position with the heat-generating components positioned above the support board 106.

Figure 4:
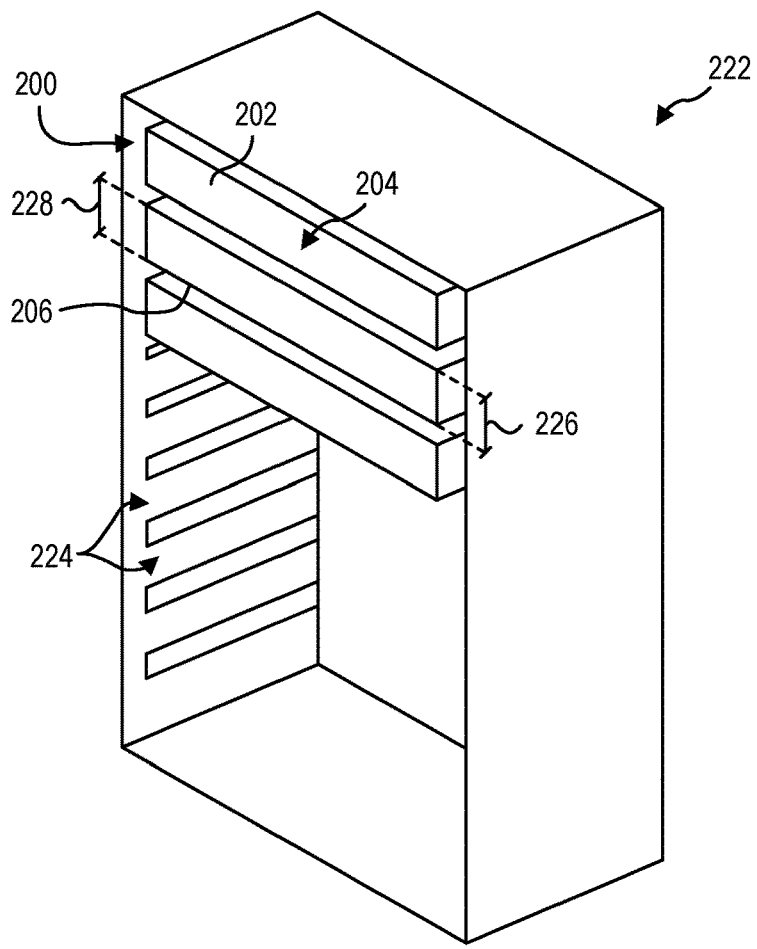
FIG. 4 is a perspective view of a server rack with a plurality of electronic devices supported thereby, according to at least one embodiment of the present disclosure.

The enclosure 102 and/or PCM 104 has a height relative to the support board 106 that is, in some embodiments, based on a dimension of a server rack in which the electronic device 100 is intended to be operated. FIG. 4 is a perspective view of an embodiment of a server rack 222 with a plurality of server slots 224 that are configured to each support a server computer. The electronic device(s) 200 are server computers that each have an enclosure 202 with a PCM 204 therein.

In some embodiments, a server slot height 226 is defined by the amount of space available for each electronic device 200 in each of the server slots 224. The electronic device 200 has a device height 228 that is defined by the combined height of the enclosure 202 and the support board 206 of the electronic device 200. The thickness of the support board 206 may be a relatively small portion of the device height 228, and the device height 228 may be substantially equal to the height of the enclosure 202. In some embodiments, the device height 228 and/or enclosure height is greater than 50% of the server slot height 226. In some embodiments, the device height 228 and/or enclosure height is greater than 75% of the server slot height 226. In some embodiments, the device height 228 and/or enclosure height is greater than 90% of the server slot height 226. In some embodiments, it is crucial that the device height 228 and/or enclosure height is less than 95% of the server slot height 226 to allow for thermal expansion without the electronic device 200 contacting an adjacent electronic device 200 or surface of the server rack 222. For example, the server slot height 226 may be approximately 45 mm, and the device height 228 and/or enclosure height is less than 45 mm.

Figure 5:
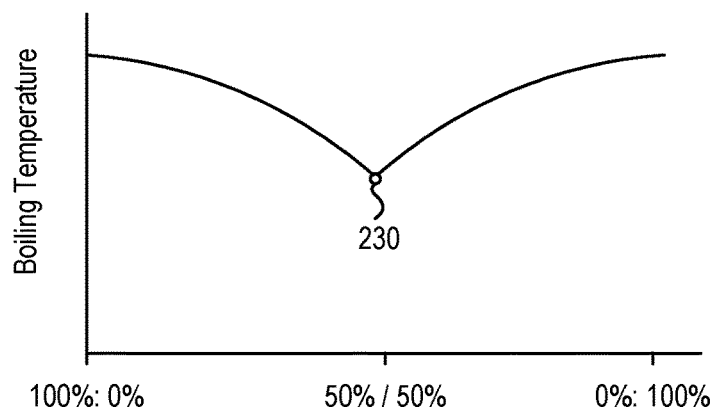
FIG. 5 is a graph of a eutectic mixture of two constituents, according to at least one embodiment of the present disclosure.

As described herein, some embodiments of a PCM according to the present disclosure is or includes a eutectic mixture. FIG. 5 is an example phase diagram of a eutectic mixture for a PCM. In some embodiments, the eutectic mixture is a homogeneous mixture of a first chemical constituent and a second chemical constituent that produces a mixture having a melting temperature that is different from either the first chemical constituent or second chemical constituent alone. In some embodiments, the eutectic mixture has a melting temperature that is less than a first melting temperature of the first chemical constituent alone (illustrated in FIG. 5 on the left side of the x-axis) and less than a second melting temperature of the second chemical constituent (illustrated in FIG. 5 on the right side of the x-axis). In some embodiments, the PCM is a eutectic mixture with a ratio of the first chemical constituent to the second chemical constituent at a eutectic point 230 that provides a lower melting temperature than either of the first melting temperature and the second melting temperature.

Figure 6:
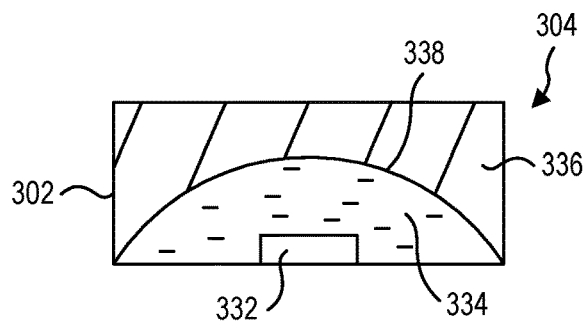
FIG. 6 is a cross-sectional view of a homogeneous phase change material (PCM), according to at least one embodiment of the present disclosure.

In other embodiments, the ratio of different chemical constituents of the PCM can be selected to provide a desired melting temperature and/or a desired thermal profile for the PCM. FIG. 6 is a side cross-sectional view of an embodiment of a PCM 304 that receives heat from heat-generating component 332 to melt a portion of the PCM 304 into a liquid phase 334. The remaining portion of the PCM 304 remains a solid phase 336 with a phase boundary 338 between the liquid phase 334 and the solid phase 336. Convective heat transfer through the liquid phase 334 continues to melt the solid phase 336 at the phase boundary 338, which limits further increase in temperature of the liquid phase 334, as the solid phase 336 absorbs heat to overcome the latent heat of melting prior to melting into the liquid phase 334.

Figures 1, 7:
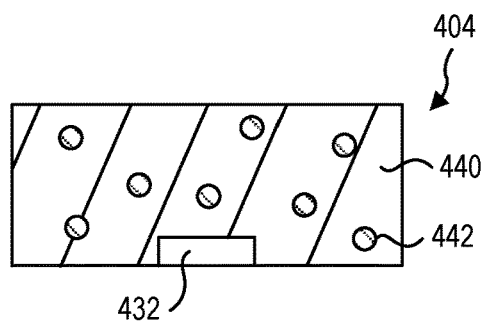
Figures 2, 7:
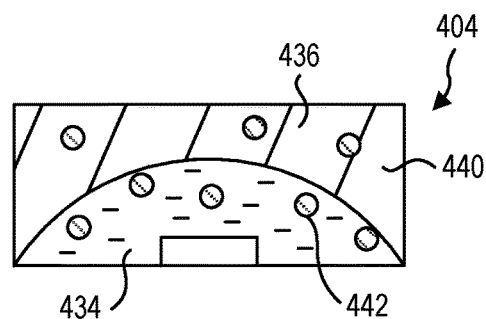

In some embodiments, such as illustrated in FIG. 7-1 and FIG. 7-2, the PCM 404 includes a heterogeneous mixture of a first chemical constituent 440 with a first melting temperature and a second chemical constituent 442 with a second melting temperature. In some embodiments, the first chemical constituent 440 and second chemical constituent 442 are miscible and mixed to produce a heterogeneous distribution in the PCM 404. In other embodiments, the first chemical constituent 440 and second chemical constituent 442 are immiscible and remain in a heterogenous distribution after mixing.

The heat-generating component 432 provides heat to the PCM 404 and begins melting the first chemical constituent 440 at the first melting temperature. As illustrated in FIG. 7-2, a portion of the first chemical constituent 440 proximate the heat-generating component 432 melts into a liquid phase 434 while a remaining portion of the first chemical constituent 440 remains a solid phase 436. However, the second chemical constituent 442 having a second melting temperature that is higher than the first melting temperature remains solid, even within the liquid phase 434 of the first chemical constituent 440. In some embodiments, substantially all of the first chemical constituent 440 melts before the liquid phase 434 continues increasing in temperature to reach the second melting temperature of the second chemical constituent 442.

A heterogeneous mixture with two melting temperatures can, therefore, provide a thermal profile with a first plateau relative to input heat from the heat-generating component 432 during melting of the first chemical constituent 440 at the first melting temperature and a second plateau relative to input heat during melting of the second chemical constituent 442 at the second melting temperature. A thermal management system according to the present disclosure, in some embodiments, provides a thermal sink to slow temperature increases of the heat-generating component(s) 432 with the PCM 404. In some embodiments, the PCM 404 is cooled by one or more active and/or passive cooling devices.

Figure 8:
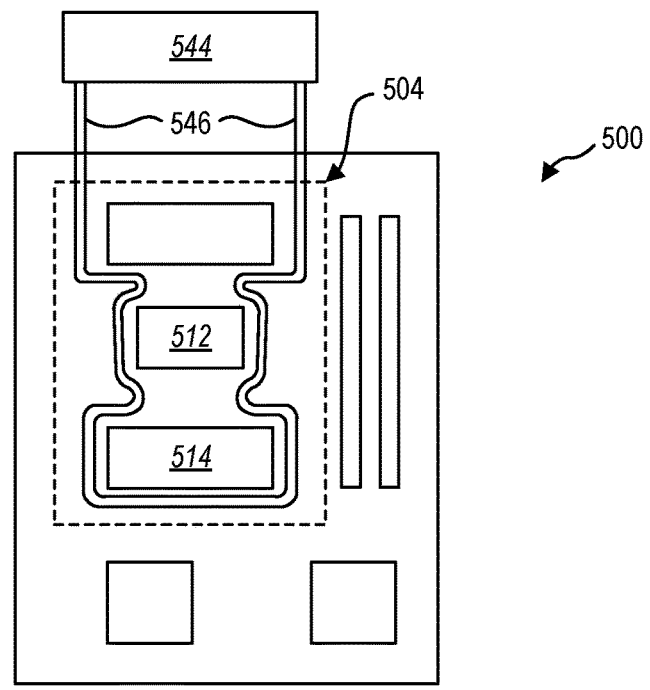
FIG. 8 is a schematic representation of an encapsulation thermal management system with active cooling, according to at least one embodiment of the present disclosure.

FIG. 8 is a schematic representation of an electronic device 500 with a PCM 504 that is actively cooled by a heat-exchanger 544. In some embodiments, a heat-exchanger 544 is connected to a cooling conduit 546 to extract heat from the PCM 504 and exhaust the heat from the electronic device 500. In some embodiments, at least a portion of the cooling conduit 546 is located inside the PCM 504. For example, at least a portion of the cooling conduit 546 may be surrounded by the PCM 504. The cooling conduit 546 is, in some embodiments, configured to flow a cooling fluid therethrough to convectively cool the PCM 504 adjacent to the cooling conduit 546 within the PCM 504. In some examples, the cooling conduit 546 circulates a liquid cooling fluid within a portion of the PCM 504. In other examples, the cooling conduit 546 circulates a gaseous cooling fluid within a portion of the PCM 504. In yet other examples, the cooling conduit 546 circulates a two-phase cooling fluid within a portion of the PCM 504 that vaporizes in the cooling conduit 546 and is condensed at the heat-exchanger 544.

In other embodiments, the cooling conduit 546 is configured to conduct heat from the PCM 504, such as a cooling rod connected to a solid-state cooling device, such as a Peltier-style cooling device. In some embodiments, the heat-exchanger 544 is a Peltier cooler that is connected to a solid, thermally conductive rod cooling conduit 546 that conducts heat from the PCM 504.

While embodiments of thermal management systems have been described herein with an enclosure to contain the PCM 504, even when in a liquid phase, some embodiments of thermal management systems may lack a separate enclosure for the PCM 504. A solid phase of the PCM 504 may contain a liquid phase therein, allowing the solid phase to function similarly to the enclosure. In some embodiments, active cooling of the PCM 504 proximate an outer surface of the PCM 504 (such as proximate a lateral side of the PCM 504 can prevent the PCM 504 from melting at the outer surface. In such embodiments, an interior portion of the PCM 504 is allowed to melt into a liquid phase while at least part of an outer portion of the PCM 504 is actively cooled below the melting temperature to contain the liquid phase.

Figure 9:
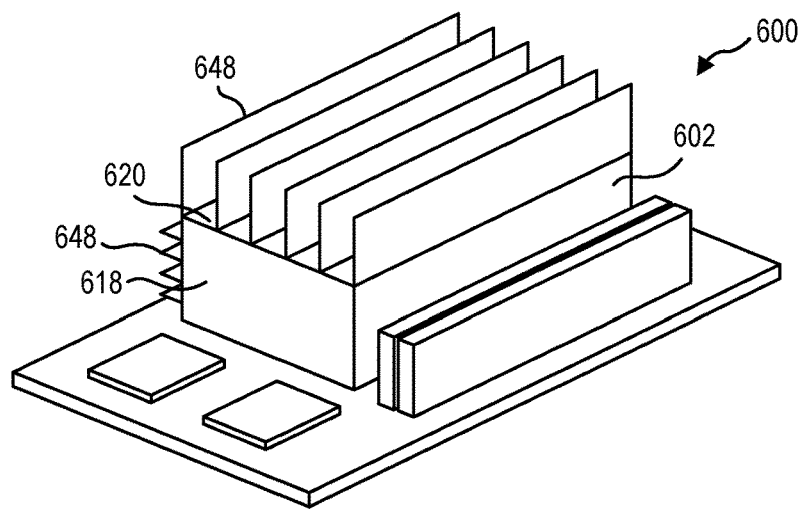
FIG. 9 is a perspective view of an encapsulation thermal management system with passive cooling, according to at least one embodiment of the present disclosure.

In some embodiments, an enclosure can provide passive cooling to the PCM. FIG. 9 is a perspective view of an embodiment of an electronic device 600 with passive cooling of an enclosure 602. The enclosure 602, in some embodiments, includes at least one heat-dissipation feature 648 that increases a surface area of the enclosure 602 to increase convective and/or radiative cooling of the enclosure 602 to the ambient atmosphere. In some embodiments, the heat-dissipation feature 648 is or includes a fin, a rod, a pin, a wire, a foil, a ridge, a channel, or another static surface feature that increases surface area. The heat-dissipation feature 648, in some embodiments, further includes a heat spreader to move heat across a surface (e.g., a lateral side 618 or top side 620) of the enclosure 602 to further distribute heat. In some embodiments, a surface of the enclosure 602 is or includes a vapor chamber or other heat spreader. In at least one embodiment, a heat spreader spreads the heat to dissipate the heat more efficiently through heat-dissipation features 648 on the enclosure 602.

INDUSTRIAL APPLICABILITY

In some embodiments, a thermal management system encases, encapsulates, or encloses at least one heat-generating component in a phase change material (PCM). A PCM can absorb a greater amount of heat than the thermal capacity and/or thermal mass of the PCM by undergoing a phase transition. Because an input energy is needed to transition between physical phases, such as a solid phase to a liquid phase, that input energy is absorbed by the PCM without an associated increase in temperature. The PCM can therefore absorb heat from a heat-generating component equal to the latent heat of melting of the PCM without the PCM increasing in temperature and continuing to absorb heat from the heat-generating component.

In some embodiments of a thermal management system according to the present disclosure, the PCM encapsulates at least one heat-generating component of an electronic device, such as a computing device. The PCM provides thermal management to the electronic device by absorbing heat from the heat-generating device. The PCM can conduct the heat away to exhaust heat from the heat-generating component, and the PCM can absorb heat through the latent heat of melting to remove heat from the heat-generating component without an associated increase in the surroundings of the heat-generating component.

The PCM encapsulates the heat-generating component by being melted or formed around the shape of the heat-generating component. In some embodiments, the PCM contacts substantially all outer surfaces of the heat-generating component. In a particular example, the PCM contacts and cools a processor of a server computer. The processor has a contact side that includes contact pins to provide electrical and/or data communication with a socket of a support board, such as a motherboard of the electronic device. The processor contacts the socket on the contact side and has outer surfaces, such as lateral sides and a top side of the processor, oriented away from and/or not contacting the support board. The PCM contacts the outer surfaces of the processor that are exposed and, in some embodiments, contacts the support board. The PCM, therefore, contacts the processor on all available surfaces that are not contacting other components of the electronic device.

In some embodiment, the heat-generating component includes a heat sink. For example, the heat-generating component may be a processor, as described herein, with a heat sink attached to a top surface thereof. The heat sink may be thermally connected to the processor by a thermal interface material to spread heat from the processor over a larger surface area than a top side of the processor alone. In some embodiments, the PCM encapsulated the heat-generating component by being positioned to encapsulate the heat sink and processor.

While a processor and, optionally, a heat spreader or heat sink, is described, other heat-generating components may be encapsulated according to the present disclosure. In some examples, a heat-generating component includes a processor, such as a central processing unit (CPU), graphical processing unit (GPU), or other specialized processor; a memory device, such as volatile memory or non-volatile memory; networking or communication devices; power supplies, converters, rectifiers, transformers, inverters, or other power management devices; or any other electronic components of the electronic device that generate heat during operation.

The PCM may encapsulate a heat-generating component of the electronic device. In some embodiments, the PCM encapsulates more than one heat-generating component of the electronic device, such as encapsulating the CPU and the GPU or encapsulating the CPU and system memory. In some embodiments, the PCM encapsulates all of the heat-generating components of the electronic device.

In some embodiments, an electronic device with a thermal management system includes a PCM in an enclosure. The enclosure encloses at least one heat-generating component fixed to the support board. In some embodiments, at least one heat-generating component is outside of the enclosure, such as the system memory 108 and/or non-volatile solid-state drive (SSD).

The enclosure 14 may be rectilinear. In other embodiments, at least a portion of the enclosure is curved or oriented at a non-orthogonal angle to another surface of the enclosure. In some embodiments, at least a portion of the enclosure is sized, shaped, or oriented to follow a size, shape, or orientation of a heat-generating component therein. For example, a shape of the enclosure may follow or conform to a physical topography of the heat-generating components enclosed therein to hold a substantially consistent thickness of PCM against the outer surfaces of the heat-generating components encapsulated in the PCM.

In some embodiments, the PCM is in direct contact with an outer surface of the heat-generating component. In other embodiments, at least a portion of the PCM contacts the heat-generating component indirectly through material or heat spreader in direct contact with the heat-generating component. For example, a heat-generating component, such as a CPU or GPU, may have a thermal interface material positioned thereon. In some embodiments, a thermal interface material or heat sink affixed thereto may be considered part of the heat-generating component. In other embodiments, a PCM is considered to be in contact with the heat-generating component when the PCM contacts the heat-generating component and any additional components affixed to the heat-generating component that have a primary purpose of distributing heat from the heat-generating component.

In addition to the thermal management benefits, in some embodiments, the PCM may provide improvements to the operational lifetime of the heat-generating components encapsulated therein by limiting and/or preventing corrosion. For example, the PCM may seal the heat-generating component against a surface of the support board such that ambient air and/or moisture cannot contact and react with at least part of the heat-generating component. For example, in a datacenter or server rack with liquid cooling systems, a liquid leak can damage electronic components of computing devices, while any heat-generating components encapsulated in PCM may be substantially protected from the liquid leak.

In some embodiments, the PCM is or includes paraffin or another wax. In other embodiments, the PCM is or includes poly chain hydrocarbons.

In some embodiments, the PCM may be or include a single chemical constituent. In other embodiments, the PCM may be or include a plurality of chemical constituents mixed or combined to provide different material properties from either chemical constituent alone. For example, and as will be described herein, the PCM may be a eutectic mixture of a plurality of chemical constituents. In some examples, the PCM may be a substantially homogeneous mixture of chemical constituents. In some examples, the PCM may be a heterogeneous mixture of chemical constituents.

In some embodiments, the PCM may be solid at greater than 10° C. In some embodiments, the PCM is solid at greater than 20° C. In some embodiments, the PCM is solid at greater than 30° C. In some embodiments, the PCM is solid at greater than 50° C.

In some embodiments, the PCM has a single melting temperature such as a PCM with a single chemical constituent. In some embodiments, the PCM is a heterogeneous mixture (e.g., immiscible mixture) of different chemical constituents with different melting temperatures, providing a PCM with two melting temperatures.

In some embodiments, the enclosure encloses a processor and at least one volatile memory module. In some embodiments, the enclosure encloses a plurality of the same type of components of the electronic device. In other embodiments, the enclosure encloses a plurality of different types of components of the electronic device.

The PCM in the enclosure contacts the heat-generating components therein, but also contacts the support board between the heat-generating components. In some embodiments, the PCM limits and/or prevents corrosion or degradation of the support board or electrical wires or circuits thereon. In some embodiments, the PCM 104 receives heat from the support board to cool the support board and sockets or other contacts that may heat during operation.

In some embodiments, the enclosure is completely filled by the PCM. For example, the PCM may completely fill an interior volume around the heat-generating components defined by the enclosure. In some embodiments, when the PCM melts, the PCM will remain in the volume defined by the lateral sides and the top surface of the enclosure. For example, if the PCM were to fill only 50% of an interior volume the enclosure, the PCM may flow to one lateral side or the other if the support board were installed vertically relative to a direction of gravity. The PCM could then leave one or more of the heat-generating components exposed without thermal management from the PCM.

However, in some embodiments, the PCM fills less than the entire interior volume of the enclosure. In some embodiments, the PCM fills a first portion of the interior volume and a second material (solid, liquid, or gas) fills a second portion of the interior volume. In some embodiments, the second material stabilizes the PCM, such as preventing aging or degradation of the PCM over time, retaining the thermal performance of the PCM to provide a longer operational lifetime of the thermal management and the electronic device.

In some embodiments, the PCM fills a portion of the interior volume of the enclosure such that all outer surfaces of the heat-generating components (e.g., processor, volatile memory) are covered by the PCM when the support board is in a horizontal position with the heat-generating components positioned above the support board. In some embodiments, the PCM fills a portion of the interior volume of the enclosure such that all outer surfaces of the heat-generating components (e.g., processor, volatile memory) are covered by the PCM when the support board 106 is positioned in a vertical position. In some embodiments, the PCM fills a portion of the interior volume of the enclosure such that all outer surfaces of the heat-generating components (e.g., processor, volatile memory) are covered by the PCM when the support board is positioned in a vertical position and when the support board is in a horizontal position with the heat-generating components positioned above the support board.

The enclosure and/or PCM has a height relative to the support board that is, in some embodiments, based on a dimension of a server rack in which the electronic device is intended to be operated. In some embodiments, a server rack has a plurality of server slots that are configured to each support a server computer. The electronic device(s) are server computers that each have an enclosure with a PCM therein.

In some embodiments, a server slot height is defined by the amount of space available for each electronic device in each of the server slots. The electronic device has a device height that is defined by the combined height of the enclosure and the support board of the electronic device. The thickness of the support board may be a relatively small portion of the device height, and the device height may be substantially equal to the height of the enclosure. In some embodiments, the device height and/or enclosure height is greater than 50% of the server slot height. In some embodiments, the device height and/or enclosure height is greater than 75% of the server slot height. In some embodiments, the device height and/or enclosure height is greater than 90% of the server slot height. In some embodiments, it is crucial that the device height and/or enclosure height is less than 95% of the server slot height to allow for thermal expansion without the electronic device contacting an adjacent electronic device or surface of the server rack. For example, the server slot height 226 may be approximately 45 mm, and the device height 228 and/or enclosure height is less than 45 mm.

As described herein, some embodiments of a PCM according to the present disclosure is or includes a eutectic mixture. n some embodiments, the eutectic mixture is a homogeneous mixture of a first chemical constituent and a second chemical constituent that produces a mixture having a melting temperature that is different from either the first chemical constituent or second chemical constituent alone. In some embodiments, the eutectic mixture has a melting temperature that is less than a first melting temperature of the first chemical constituent alone and less than a second melting temperature of the second chemical constituent. In some embodiments, the PCM is a eutectic mixture with a ratio of the first chemical constituent to the second chemical constituent at a eutectic point that provides a lower melting temperature than either of the first melting temperature and the second melting temperature.

In other embodiments, the ratio of different chemical constituents of the PCM can be selected to provide a desired melting temperature and/or a desired thermal profile for the PCM. In some embodiments, a PCM receives heat from heat-generating component to melt a portion of the PCM into a liquid phase. The remaining portion of the PCM remains a solid phase with a phase boundary between the liquid phase and the solid phase. Convective heat transfer through liquid phase continues to melt the solid phase at the phase boundary, which limits further increase in temperature of the liquid phase, as the solid phase absorbs heat to overcome the latent heat of melting prior to melting into the liquid phase.

In some embodiments, the PCM includes a heterogeneous mixture of a first chemical constituent with a first melting temperature and a second chemical constituent with a second melting temperature. In some embodiments, the first chemical constituent and second chemical constituent are miscible and mixed to produce a heterogeneous distribution in the PCM. In other embodiments, the first chemical constituent and second chemical constituent are immiscible and remain in a heterogenous distribution after mixing.

The heat-generating component provides heat to the PCM and begins melting the first chemical constituent at the first melting temperature. In some embodiments, a portion of the first chemical constituent proximate the heat-generating component melts into a liquid phase while a remaining portion of the first chemical constituent remains a solid phase. However, the second chemical constituent having a second melting temperature that is higher than the first melting temperature remains solid, even within the liquid phase of the first chemical constituent. In some embodiments, substantially all of the first chemical constituent melts before the liquid phase continues increasing in temperature to reach the second melting temperature of the second chemical constituent.

A heterogeneous mixture with two melting temperatures can, therefore, provide a thermal profile with a first plateau relative to input heat from the heat-generating component during melting of the first chemical constituent at the first melting temperature and a second plateau relative to input heat during melting of the second chemical constituent at the second melting temperature. A thermal management system according to the present disclosure, in some embodiments, provides a thermal sink to slow temperature increases of the heat-generating component(s) with the PCM. In some embodiments, the PCM is cooled by one or more active and/or passive cooling devices.

In some embodiments, a heat-exchanger is connected to a cooling conduit to extract heat from the PCM and exhaust the heat from the electronic device. In some embodiments, at least a portion of the cooling conduit is located inside the PCM. For example, at least a portion of the cooling conduit may be surrounded by PCM. The cooling conduit is, in some embodiments, configured to flow a cooling fluid therethrough to convectively cool the PCM adjacent to the cooling conduit within the PCM. In some examples, the cooling conduit circulates a liquid cooling fluid within a portion of the PCM. In other examples, the cooling conduit circulates a gaseous cooling fluid within a portion of the PCM. In yet other examples, the cooling conduit circulates a two-phase cooling fluid within a portion of the PCM that vaporizes in the cooling conduit and is condensed at the heat-exchanger.

In other embodiments, the cooling conduit is configured to conduct heat from the PCM, such as a cooling rod connected to a solid-state cooling device, such as a Peltier-style cooling device. In some embodiments, the heat-exchanger is a Peltier cooler that is connected to a solid, thermally conductive rod cooling conduit that conducts heat from the PCM.

While embodiments of thermal management systems have been described herein with an enclosure to contain the PCM, even when in a liquid phase, some embodiments of thermal management systems may lack a separate enclosure for the PCM. A solid phase of the PCM may contain a liquid phase therein, allowing the solid phase to function similarly to the enclosure. In some embodiments, active cooling of the PCM proximate an outer surface of the PCM (such as proximate a lateral side of the PCM can prevent the PCM from melting at the outer surface. In such embodiments, an interior portion of the PCM is allowed to melt into a liquid phase while at least part of an outer portion of the PCM is actively cooled below the melting temperature to contain the liquid phase.

In some embodiments, an enclosure can provide passive cooling to the PCM. The enclosure, in some embodiments, includes at least one heat-dissipation feature that increases a surface area of the enclosure to increase convective and/or radiative cooling of the enclosure to the ambient atmosphere. In some embodiments, the heat-dissipation feature is or includes a fin, a rod, a pin, a wire, a foil, a ridge, a channel, or another static surface feature that increases surface area. The heat-dissipation feature, in some embodiments, further includes a heat spreader to move heat across a surface (e.g., a lateral side or top side) of the enclosure to further distribute heat. In some embodiments, a surface of the enclosure is or includes a vapor chamber or other heat spreader. In at least one embodiment, a heat spreader spreads the heat to dissipate the heat more efficiently through heat-dissipation features on the enclosure.

The present disclosure relates to systems and methods for cooling heat-generating components of a computer or computing device according to at least the examples provided in the sections below:

[A1] In some embodiments, a thermal management system for a computing device includes a support board, a heat-generating component fixed to the support board, an enclosure, and a PCM. The heat-generating component is fixed to the support board on a first side of the support board, and the enclosure is fixed to the first side of the support board and encloses at least the heat-generating component. The PCM is positioned in the enclosure and configured to receive heat from the heat-generating component. The PCM is solid at 10° C.

[A2] In some embodiments, the PCM of [A1] includes paraffin.

[A3] In some embodiments, the enclosure of [A1] or [A2] includes a heat-dissipation feature on an outer surface thereof.

[A4] In some embodiments, the PCM of any of [A1] through [A3] directly contacts the heat-generating component.

[A5] In some embodiments, the PCM of any of [A1] through [A4] completely fills an interior volume of the enclosure.

[A6] In some embodiments, the PCM of any of [A1] through [A5] includes at least two chemical constituents.

[A7] In some embodiments, the two chemical constituents of [A6] are miscible.

[A8] In some embodiments, the two chemical constituents of [A6] or [A7] have different melting temperatures.

[A9] In some embodiments, the PCM of any of [A6] through [A8] is a eutectic mixture.

[A10] In some embodiments, the PCM of any of [A1] through [A9] has a melting temperature between 50° C. and 90° C.

[A11] In some embodiments, a device height of the enclosure and support board of any of [A1] through [A10] is between 50% and 95% of a server slot height of a server slot.

[B1] In some embodiments, a thermal management system for a computing device includes a support board, a heat-generating component fixed to the support board, an enclosure, a PCM, and a cooling conduit. The heat-generating component is fixed to the support board on a first side of the support board, and the enclosure is fixed to the first side of the support board and encloses at least the heat-generating component. The PCM is positioned in the enclosure and configured to receive heat from the heat-generating component. The PCM is solid at 10° C. The cooling conduit is positioned at least partially in the enclosure and contacting the PCM.

[B2] In some embodiments, the cooling conduit of [B1] is configured to flow a liquid cooling fluid.

[B3] In some embodiments, the thermal management system of [B2] includes a heat-exchanger to cool the liquid cooling fluid.

[B4] In some embodiments, the cooling conduit of [B1] is a heat pipe.

[B5] In some embodiments, the cooling conduit of [B1] is thermally connected to a solid-state cooling device.

[C1] In some embodiments, a thermal management system for a computing device includes a support board, a heat-generating component fixed to the support board, and a PCM. The heat-generating component is fixed to the support board on a first side of the support board. The PCM is positioned in the enclosure and configured to receive heat from the heat-generating component. The PCM is solid at 10° C.

[C2] In some embodiments, the thermal management system of [C1] includes a cooling conduit positioned at least partially in the PCM.

[C3] In some embodiments, the cooling conduit of [C2] is configured to cool at least a portion of an outer surface of the PCM below a melting temperature of the PCM.

[C4] In some embodiments, the portion of the outer surface of [C3] is a lateral surface relative to a direction of gravity.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system for a computing device, the thermal management system comprising:
    a support board;
    a heat-generating component fixed to the support board on a first side of the support board;
    an enclosure fixed to the first side of the support board and enclosing at least the heat-generating component;
    a phase change material (PCM) positioned in the enclosure and filling a first portion of an interior volume of the enclosure and configured to receive heat from the heat-generating component wherein the PCM is solid at 10° C.; and
    a second material positioned in the enclosure and filling a second portion of the interior volume of the enclosure, wherein the second material is configured to stabilize the PCM to prevent degradation over time.

2. The thermal management system of claim 1, wherein the PCM includes paraffin.

3. The thermal management system of claim 1, wherein the enclosure includes a heat-dissipation feature on an outer surface thereof.

4. The thermal management system of claim 1, wherein the PCM directly contacts the heat-generating component.

5. The thermal management system of claim 1, wherein the PCM completely fills an interior volume of the enclosure.

6. The thermal management system of claim 1, wherein the PCM includes at least two chemical constituents.

7. The thermal management system of claim 6, wherein the two chemical constituents are miscible.

8. The thermal management system of claim 6, wherein the two chemical constituents have different melting temperatures.

9. The thermal management system of claim 6, wherein the PCM is a eutectic mixture.

10. The thermal management system of claim 1, wherein the PCM has a melting temperature between 50° C. and 90° C.

11. The thermal management system of claim 1, wherein a device height of the enclosure and support board is between 50% and 95% of a server slot height of a server slot.

12. A thermal management system for a computing device, the thermal management system comprising:
    a support board;
    a heat-generating component fixed to the support board on a first side of the support board;
    an enclosure fixed to the first side of the support board and enclosing at least the heat-generating component;
    a phase change material (PCM) positioned in the enclosure and filling a first portion of an interior volume of the enclosure and configured to receive heat from the heat-generating component wherein the PCM is solid at 10° C.;
    a second material positioned in the enclosure and filling a second portion of the interior volume of the enclosure, wherein the second material is configured to stabilize the PCM to prevent degradation over time; and
    a cooling conduit positioned at least partially in the enclosure and contacting the PCM.

13. The thermal management system of claim 12, wherein the cooling conduit is configured to flow a liquid cooling fluid.

14. The thermal management system of claim 13, further comprising a heat-exchanger to cool the liquid cooling fluid.

15. The thermal management system of claim 12, wherein the cooling conduit is a heat pipe.

16. The thermal management system of claim 12, wherein the cooling conduit is thermally connected to a solid-state cooling device.

17. A thermal management system for a computing device, the thermal management system comprising:
    a support board;
    a heat-generating component fixed to the support board on a first side of the support board;
    a phase change material (PCM) encapsulating the heat-generating component and filling a first portion of an interior volume of an enclosure and contacting the support board, wherein the PCM is configured to receive heat from the heat-generating component and the PCM is solid at 10° C.; and
    a second material positioned in the enclosure and filling a second portion of the interior volume of the enclosure, wherein the second material is configured to stabilize the PCM to prevent degradation over time.

18. The thermal management system of claim 17, further comprising a cooling conduit positioned at least partially in the PCM.

19. The thermal management system of claim 18, wherein the cooling conduit is configured to cool at least a portion of an outer surface of the PCM below a melting temperature of the PCM.

20. The thermal management system of claim 19, wherein the portion of the outer surface is a lateral surface relative to a direction of gravity.

* * * * *